United States Patent
Hiller

(12)
(10) Patent No.: US 6,327,408 B1
(45) Date of Patent: Dec. 4, 2001

(54) ELECTRICAL INTERCONNECTION OF PLANAR LIGHTWAVE CIRCUITS

(75) Inventor: Dietmar Hiller, Fountainebleau (FR)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/435,105

(22) Filed: Nov. 5, 1999

(30) Foreign Application Priority Data

Oct. 19, 1999 (EP) .................................. 99402582

(51) Int. Cl.⁷ .................................. G02B 6/30
(52) U.S. Cl. .................................. 385/49; 385/88
(58) Field of Search .................................. 385/49, 88–94, 385/14

(56) References Cited

U.S. PATENT DOCUMENTS

| | | |
|---|---|---|
| 4,233,619 * | 11/1980 | Webb et al. . |
| 4,647,148 | 3/1987 | Katagiri .................................. 350/96.2 |
| 4,757,317 | 7/1988 | Comstock et al. . |
| 5,119,448 | 6/1992 | Shaefer et al. . |
| 5,123,065 | 6/1992 | Enochs . |
| 5,148,506 | 9/1992 | McDonald . |
| 5,198,963 | 3/1993 | Gupta et al. . |
| 5,226,099 | 7/1993 | Mignardi et al. . |
| 5,231,305 | 7/1993 | Russell . |
| 5,444,727 | 8/1995 | Mathoorasing . |
| 5,621,837 * | 4/1997 | Yamada et al. . |
| 6,137,815 | 10/2000 | Sasao et al. .................................. 372/36 |

FOREIGN PATENT DOCUMENTS

| | | |
|---|---|---|
| 0147359 | 7/1985 | (EP) . |
| 0304118 | 2/1989 | (EP) . |
| 0884782 | 12/1998 | (EP) . |
| 0903600 | 3/1999 | (EP) . |
| 60032088 | 2/1985 | (JP) . |
| 60263891 | 11/1985 | (JP) . |
| 61140379 | 6/1986 | (JP) . |
| 01200649 | 8/1989 | (JP) . |
| 04064828 | 3/1992 | (JP) . |

OTHER PUBLICATIONS

Micro–optic mechanical Devices Fabricated by Anisotropic Etching of (110) Silicon, Sep. 13, 1995.
Arrays of Thermal Micro–Actuators Coupled to Micro–Optical Components, SPIE vol. 2865, 3/96.

* cited by examiner

Primary Examiner—Hung N. Ngo
(74) Attorney, Agent, or Firm—Price, Heneveld, Cooper, DeWitt & Litton

(57) ABSTRACT

A package for an electrical/optical component includes an optical component and one or more bridges of insulating material mounted in spaced relationship to the optical component. Electrical components are mounted on the bridge on a side opposite the optical component. Electrical connection from the electrical component to conductors on the side of the bridge facing the optical component is made by plated through-hole connections extending through the bridge. Relatively short electrical conductors are employed to interconnect the optical component with conductors formed on the bridge and to connecting pins extending from the package. In another embodiment, one or more bridges are positioned with electrical conductors of a bridge coupled in direct electrical contact with the connector pins using a conductive bonding agent, such as a conductive adhesive material or solder. In a further embodiment, the bridge includes a plurality of electrical contacts on a side facing an optical component within the package. Electrical contacts between the optical component and the contacts on the surface of the bridge facing the optical component and the connector pins are directly made using a conductive bonding agent, such as a conductive adhesive, or solder. Through-hole connections couple the conductors on the first side of the bridge with an electrical component mounted on the second side of the bridge.

25 Claims, 3 Drawing Sheets

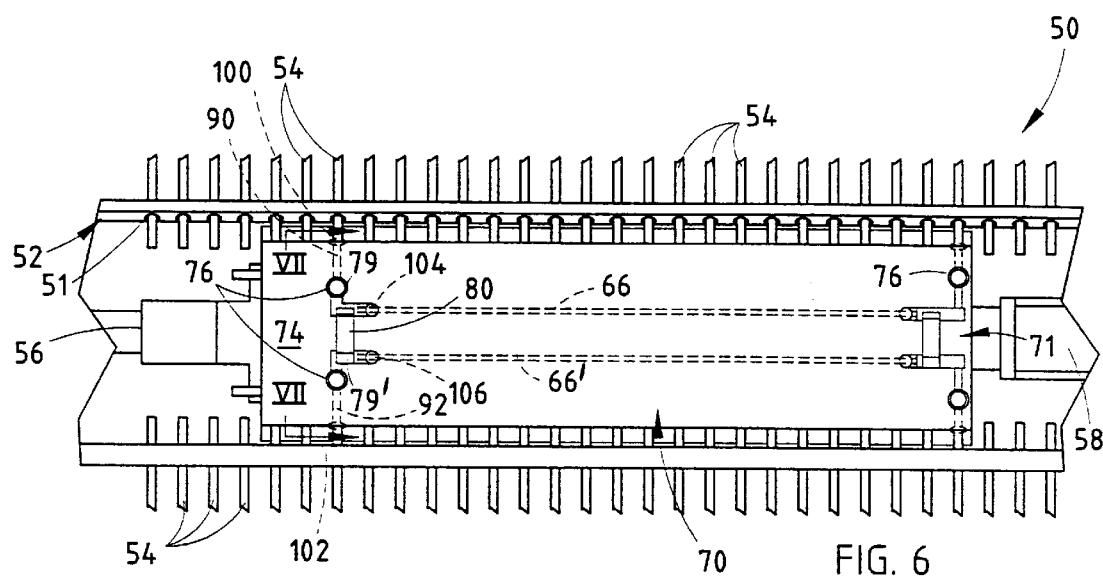
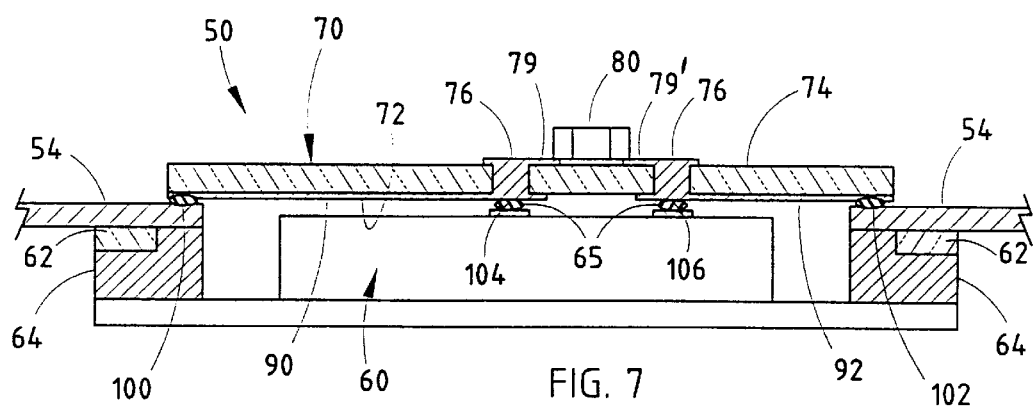

ELECTRICAL INTERCONNECTION OF PLANAR LIGHTWAVE CIRCUITS

BACKGROUND OF THE INVENTION

1. Field of the Invention

The present invention relates to the connection of optical and electrical components on an integrated package and particularly the electrical interconnection of optical components to electrical components.

2. Technical Background

As optical fibers increase in their use in communication systems, there is an ever increasing need for a higher degree of integration of optical components and electrical components in fiber optic applications. Also, the components themselves have become increasingly complex. Conventional wire interconnections typically employ gold wires having a diameter from 25 to 33 micrometers ($\mu$m) connecting electrical lines of, for example, a planar lightwave circuit to the pin connections for the package. The mechanical resonant frequency of a wire of, for example, 25 micrometers in diameter and 2.5 mm in length is approximately 2.2 kHz. Quality control tests, such as the Bellcore qualification test, requires vibration testing in the frequency range of from 10 Hz to 2 kHz. With relatively long wires of the prior art, as the resonant frequency is approached or reached, there is a tendency for the wire bonds to break loose due to vibration, thereby causing failure of the packaged component. In order to alleviate this problem, the length of interconnecting conductors have been shortened to approximately 1 mm to raise the resonant frequency of such conductors to about 5 kHz. This technique of the prior art is known as "stitching" and, although reducing or eliminating the failure of components due to vibration, it increases the number of bonds as well as requiring island pads for the interconnection of series coupled shorter conductors.

Another approach in connection optical components to electrical components is the use of feed lines which are conductors printed on a substrate extending across a package. For components such as a thermal-optic 8×8 switch can result in over 200 electrical connections. The lines must have a size sufficient to maintain their resistance relatively low in order to avoid parasitic heating while at the same time there must be sufficient spacing between adjacent lines to prevent electrical cross talk. These factors lead to the consumption of a considerable amount of the surface area of a package, and, while reducing some of the problems inherent with separate electrical conductors, the use of parallel feed lines does not result in a compact hybrid package.

There exists a need, therefore, for packaging technique and structure for optical/electrical devices in a single package which alleviates the problems with wire bonds and connection techniques of the prior art.

SUMMARY OF THE INVENTION

The interconnection system of the present invention provides a package for an optical/electrical component including an optical component and one or more bridges of insulating material in spaced relationship to the optical component. Electrical components are mounted on the bridge on a side opposite the optical component. Electrical connection from the electrical component to conductors on the side of the bridge facing the optical component is made by plated through-hole connections extending through the bridge. Relatively short electrical conductors are employed to interconnect the optical component with the electrical component and the optical or electrical components to connecting pins extending from the package.

In another embodiment of the invention, one or more bridges are positioned with electrical conductors of a bridge coupled in direct electrical contact with the connector pins using a conductive bonding agent, such as a conductive adhesive material or solder. Electrical contacts on the second side of the bridge are coupled to the first side using plated through-hole connections extending through the bridge and to electrical components, which are coupled to the optical component by relatively short wire connections.

In a further embodiment of the invention, the bridge includes a plurality of electrical conductors or contacts on a side facing an optical component within the package. Electrical contacts between the optical device and the contacts on the surface of the bridge facing the optical component and the connector pins are directly made using a conductive bonding agent, such as a conductive adhesive, or solder. Through-hole connections couple the conductors on the first side of the bridge with an electrical component mounted on the second side of the bridge. This structure eliminates wire connections between the electrical component and optical component and between both of the components and the connector pins. In each embodiment, the number of wire bonds is greatly reduced or eliminated in an electro/optical package resulting in a less expensive more reliable component.

Additional features and advantages of the invention will be set forth in the detailed description which follows and will be apparent to those skilled in the art from the description or recognized by practicing the invention as described in the description which follows together with the claims and appended drawings.

It is to be understood that the foregoing description is exemplary of the invention only and is intended to provide an overview for the understanding of the nature and character of the invention as it is defined by the claims. The accompanying drawings are included to provide a further understanding of the invention and are incorporated and constitute part of this specification. The drawings illustrate various features and embodiments of the invention which, together with their description serve to explain the principals and operation of the invention.

BRIEF DESCRIPTION OF THE DRAWINGS

FIG. 6 is a fragmentary top plan view of a package for a planar lightwave circuit according to another embodiment of the invention; and FIG. 7 is a cross-sectional view of the embodiment of the package shown in FIG. 6, taken along section line VII—VII of FIG. 6.

DETAILED DESCRIPTION OF THE PREFERRED EMBODIMENT

Figure 1:
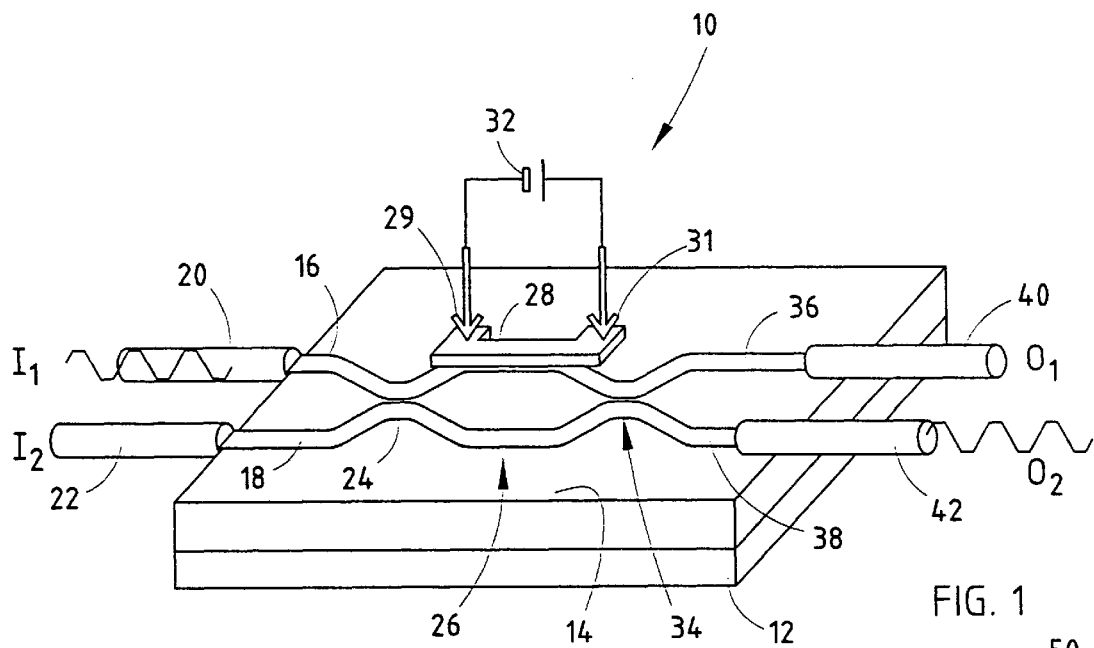
FIG. 1 is a fragmentary perspective schematic view of a planar lightwave circuit with which the present invention is employed.

The present invention relates to the packaging of planar lightwave circuits, such as optical switches and the like, which integrally include thereon an electrical component, such as a resistive heater, to which electrical connections must be made. Additionally, these devices frequently will be packaged with other electrical components, such as light emitting diodes, resistors, capacitors, or other passive electrical components, to which the planar lightwave circuit is coupled in a communications network. FIG. 1 shows a 2×2 optical switch 10 in a Mach-Zehnder configuration, illustrating the type of planar lightwave circuit with which the present invention can be employed.

Switch 10, shown in FIG. 1, comprises a silicon substrate 12 to which a silica cladding 14 is applied. A pair of waveguides 16 and 18 embedded in the cladding 14. A first input optical fiber 20 and a second input optical fiber 22 are coupled to waveguides 16 and 18, respectively. Waveguides 16 and 18 are joined in a coupler 24, which is integral with a Mach-Zehnder interferometer 26. The length of one leg of the interferometer is selectively controlled by a thermal-resistive element 28 to which electrical connections 29 and 31 are made for applying electrical power from a source (represented by battery 32) for switching input $I_1$ or input $I_2$ to output $O_1$ or output $O_2$. A second coupler 34 joins the legs of the Mach-Zehnder interferometer 26 and lead to output waveguides 36 and 38 coupled, respectively, to a first output optical fiber 40 and a second optical output fiber 42, respectively. As is known, by applying electrical power to the thermal-resistive element 28, the input signals on optical fiber 20 can be switched from the output of optical fiber 40 to optical fiber 42 and similarly the input signals on input fiber 22 can be switched to either of the outputs 40 or 42.

In this 2×2 switch, two electrical interconnections are made to the thermal-resistive element 28. With a 2×8 switch, there are 7 thermal-resistive elements requiring 14 electrical connections, while in a more complex switch, such as an 8–8 switch, there are 112 heating elements requiring 224 electrical connections. Thus, as a planar lightwave circuit, such as circuit 10, increases in size and, therefore, complexity, the number of electrical connections to the planar lightwave circuit itself increase. Also, with such circuits, the number of passive electrical components such as resistors, capacitors, LEDs or other separate electrical components used with the planar lightwave circuit but which are in the same package of the device, also increase dramatically.

In the past, as noted in the background, separate electrical connections are made to separate circuit boards utilizing wire bonding, either relatively lengthy gold wires, shorter "stitched" wires, or printed feed lines to provide such electrical connections. The system of the present invention provides a unique package which eliminates the wire bond breakage problem and heat generation problems while providing the high density packaging of optical/electrical components.

Figure 2:
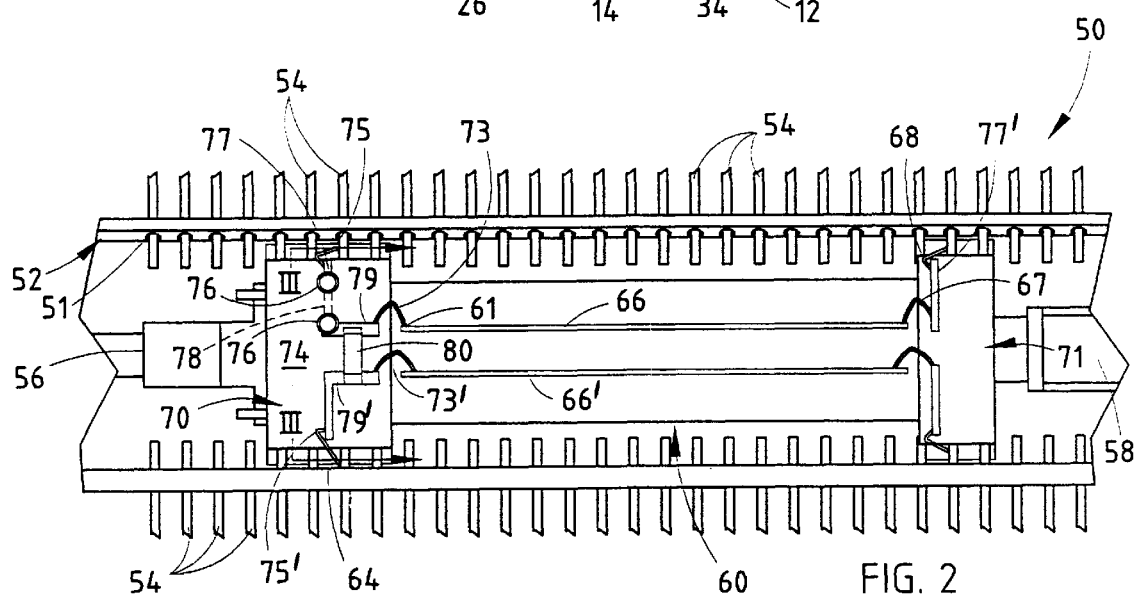
FIG. 2 is a fragmentary top plan view of a package for a planar lightwave circuit according to a first embodiment of the present invention.

Referring now to FIG. 2, there is shown a packaged optical/electrical component 50 embodying the present invention, with the top cover removed so that the interior of the package can be clearly seen. The package includes a gold-plated housing 52 made of Kovar®, which is an alloy of iron, nickel and cobalt. The housing, however, can be made of other materials, however, including a suitable polymeric material. Housing 52 has a plurality of conductive contact pins 54 which conventionally extend through feed-through insulators 51 in package 50, such that electrical connection to the interior components of package 50 can be made. The package includes an input optical fiber bundle 56 and an output optical fiber bundle 58 coupled to an optical component, such as a planar lightwave circuit such as switch 60, which can be a 2×2 switch with a Mach-Zehnder configuration as shown in FIG. 1 or numerous switches having multiple inputs and outputs or any other optical component which requires connection to an electrical conductor. A tunable fiber-Bragg grating and an optical amplifier are examples only of such optical components.

Figure 3:
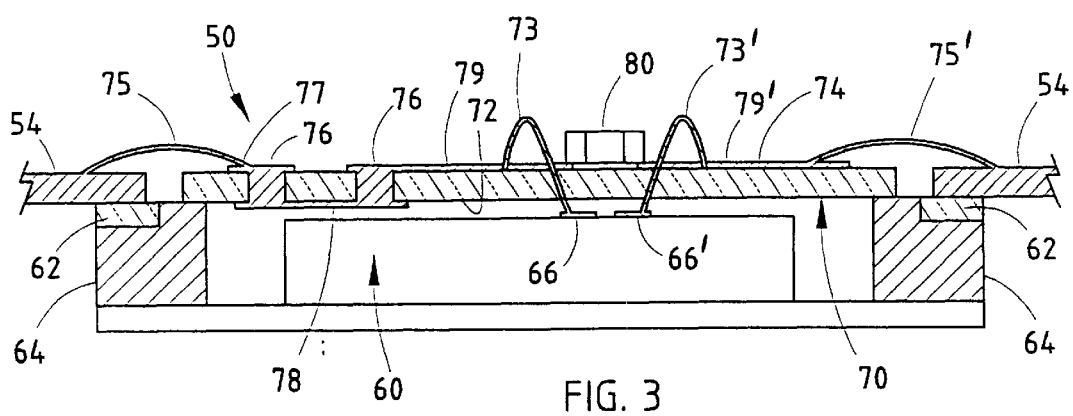
FIG. 3 is a cross-sectional view, partly in schematic form, of the packaging of the planar lightwave circuit shown in FIG. 2, taken along section line III—III of FIG. 2.

Package 50 includes shoulders 64 (FIG. 3) with pads 62 of insulating material on opposite sides of the optical component 60 for supporting the contact pins 54. Shoulders 64 also support a pair of planar bridges 70, 71 which, in the preferred embodiment, comprise an insulating material made of aluminum ($Al_2O_3$), ceramic, glass, or other suitable material, such as a fiber epoxy. Bridges 70, 71 are secured to shoulders 64 of the housing 52 by a suitable bonding adhesive. In the embodiment shown, the bridges constitute planar generally rectangular members having a width slightly less than the width of the interior of package 50 to rest on shoulders 64 and a length selected to carry the desired number of electrical components or conductors to be coupled to the optical component 60 or pins 54. The thickness of the bridges, in the preferred embodiment, was approximately 0.5 to 1 mm. Bridges 70, 71 have a first surface 72 spaced above the optical switch 60 a distance of from about 25 to 100 $\mu$m and an opposite or top surface 74 which can accommodate electrical components 80, such as resistors, capacitors, transimpedance amplifiers, photo diodes and the like. Bridge 70 includes a pair of through-hole conductors 76 located to allow conductors, such as a short wire conductor 75 (<1 mm) coupled from one of the connector pins 54 as seen in FIG. 3, to a surface conductor 77 coupled to the through-hole conductor 76 for supplying electrical signals or power from the pin to a conductor 78 on the lower surface 72 of bridge 70. The use of through-hole conductors 75 provides a short, trouble-free direct coupling between the opposite surfaces 72, 74 of the bridge 70, such that a connector pin 54 can be coupled through a short conductor, such as conductor 75, having a length of less than about 1 mm to patterned conductors formed on surfaces 72 or 78 for coupling to other pin connectors or components through additional through-hole conductors. The through-hole conductors 76 are formed by providing apertures in the bridges 70, 71 where desired and plating the edges of the apertures with a conductive material, such as a copper or gold in some applications. The conductors 77 and 78 on the surfaces of the bridge are formed by screen printing, marked deposition, or other conventional means.

In the example shown in FIGS. 2 and 3, conductor 75 is coupled to conductors 77, 79 on the top surface 74 of bridge 70 which are also electrically coupled to through-hole conductors 76 and conductor 78 on the under surface 72 of bridge 70. Conductor 79 is coupled by a short (less than 1 mm) wire conductor 73 to one end 61 of a first resistance heating film 66 on the optical switch 60. The opposite end of film 66 is coupled by a short wire 67 (FIG. 2) to a conductor 77' on bridge 71 and to a connector pin 54 through another short wire 68. Thus, bridges 70, 71 provide a convenient mounting platform for printed-on conductors and components to eliminate long or multiple wire connections and allow control signals from a pair of connector pins 54 to be applied to a controlling thermal heater 66 of optical component 60. A second heater 66' is similarly coupled via bridges 70, 71 to connector pins 54 associated with heater 66', as seen in FIGS. 2 and 3.

In addition to coupling connector pins 54 to electrical contacts of the optical component 60, bridges 70, 71 provide a platform for the physical mounting of additional electrical components and their electrical connection to the optical component 60. In FIG. 2, for example, a resistor 80 is mounted to surface 74 of bridge 70 and is coupled between top conductors 79 and 79'. Other electrical components can similarly be mounted and electrically coupled to conductors on the surfaces of bridges 70, 71 by short electrical conductors and through-hole conductors. Thus, by the use of bridge 70 and through-hole conductors which extend from the first surface to the second opposite surface of the bridge, fewer relatively short conductors allow the coupling of the external pin connectors for the package to the optical switch.

As can be appreciated, numerous components can be mounted to the relatively large upper surface 74 of bridge 70 which provides a significant mounting surface for such components. In this embodiment, although short electrical conductors are employed, the bridges 70, 71 minimize the size of the package while maximizing the amount of electrical components which can be closely positioned with respect to the optical components such that they can be easily interconnected by providing short wire connections between the electrical and optical components.

Figure 4:
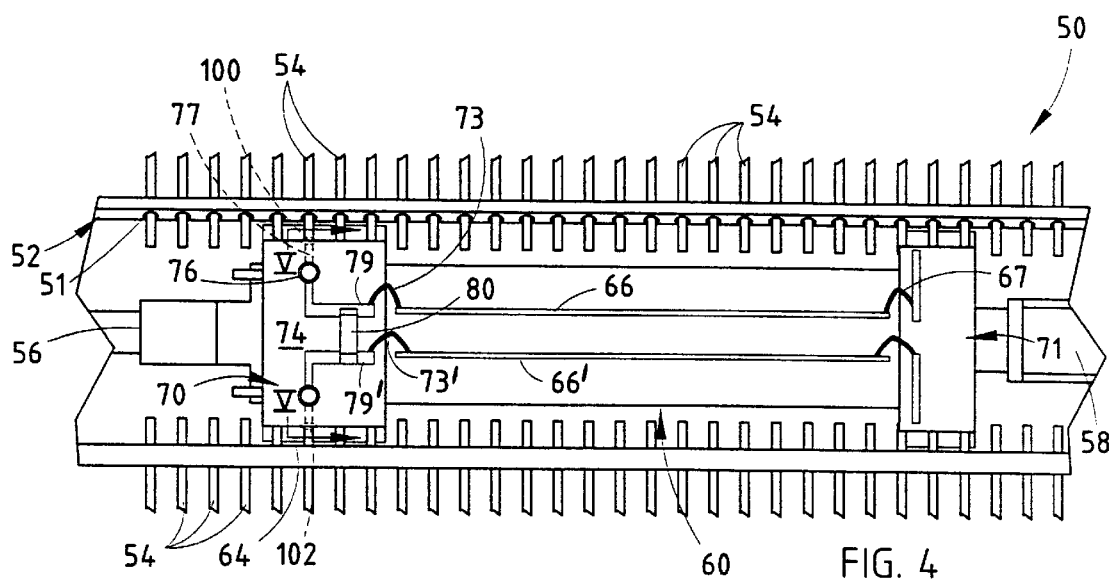
FIG. 4 is a fragmentary top plan view of a package for a planar lightwave circuit according to a second embodiment of the present invention.
Figure 5:
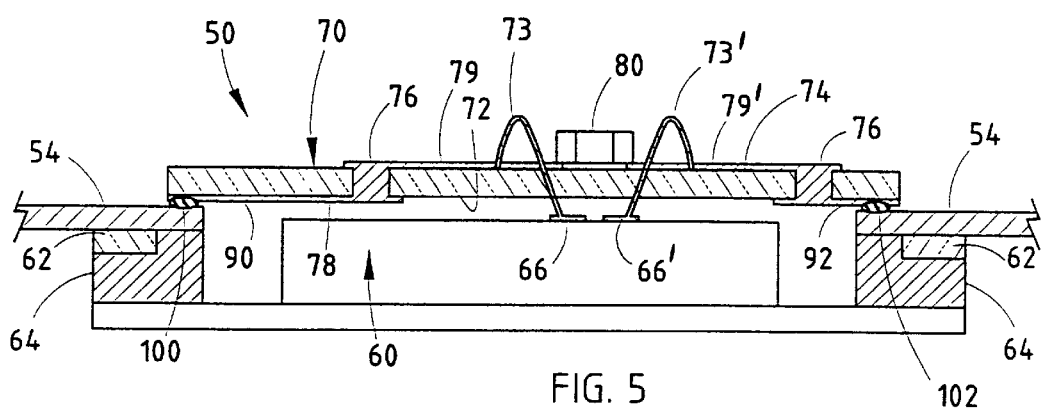
FIG. 5 is a cross-sectional view of the second embodiment of the package shown in FIG. 4, taken along section line V—V of FIG. 4.

In an alternative embodiment illustrated in FIGS. 4 and 5, the same reference numerals are used for parts which are the same or similar to those shown in FIGS. 2 and 3. In the embodiment shown in FIGS. 4 and 5, the electrical contacts for the connection of electrical components mounted to the bridge 70 are made directly to the outwardly extending pin connectors 54 by bonding electrical conductors 90, 92 printed on the lower surface 72 of bridge 70 by means of a conductive bonding agent 100, 102 such that electrical contact is made between the pin connectors 54 and mating conductors 90, 92. The bonding agent 100, 102 may be any suitable conductive adhesive, such as a silver-charged epoxy such as EPO-Tek H20E. The epoxy is applied to the appropriate conductors 90, 92 on the lower surface 72 of bridge 70 by a glue dispensing syringe on an XY positioner or can be applied by screen printing. Once applied, the bridge 70 (and bridge 71), having a predetermined pattern of conductors 90, 92 corresponding to and communicating with through-hole plated conductors 76 as in the embodiment of FIGS. 2 and 3, is positioned over the package 52 in alignment therewith and allowed to cure providing mechanical and electrical contact between the electrical conductors on bridges 70, 71 and the connecting pins 54. The upper surface 74 of bridge 70 may support, as in the first embodiment, a plurality of electrical components 80 which may be coupled to the optical switch or other optical component 60 by means of short wires 73, 73'. Through-hole conductors 76 provide a connection between the external connector pins 54 and the conductors 90, 92 to component 80 through the top surface printed conductors 79, 79'. As can be appreciated with a multiple pole switch, numerous connections are made in a repeated fashion. With this embodiment, the short wire connections 75 of the FIGS. 2 and 3 embodiment are eliminated by the direct bonding of the conductors 90, 92 to the connector pins 54.

In yet another embodiment of the invention, the relatively short wire conductors employed in the earlier embodiments are completely eliminated by the structure shown in FIGS. 6 and 7. In this embodiment, a single bridge 70 is employed and substantially covers the optical component 60. A pattern of conductors 90, 92 are printed on the lower surface 72 of bridge 70 and selectively communicate with electrical components 80 on the upper or opposite surface 74 of bridge 70 by through-hole conductors 76. The pattern of conductors 90, 92 are directly coupled to the external connecting pins 54 of the package 50 by a conductive bonding agent at 100, 102 as in the embodiment of FIGS. 4 and 5. Additionally, these conductors are directly coupled to electrical contacts 65 on resistive elements 66, 66' on, for example, optical switch 60 by a conductive bonding agent at 104, 106.

Thus, a pattern of conductive bonding agents placed on the conductors 90, 92 on the lower surface 72 of bridge 70 provides the electrical connections of the optical component to the conductors 90, 92 and from the conductors 90, 92 to the external connecting pins 54, thereby eliminating all separate wire connections. Plated through-hole conductors 76 extend between conductors 90, 92 on the lower surface 72 of bridge 70 to conductors 79, 79' on the top surface 74 to which electrical components, such as a resistor 80, is surface mounted. The spacing of the lower surface of bridge 70 optical component 60 is about 75 to 100 $\mu$m to assure the bonding agent contacts and bonds conductors 90, 92 to pins 54 and to contacts 65 of resistive elements 66, 66' of the optical component 60. The same bonding agent used in the second embodiment is employed and applied using a syringe or by screen printing.

In each of the embodiments, one or more bridges are positioned in alignment within a housing for an optical component package over the optical component to minimize wire interconnections, if any, between the electrical conductors on the bridges, the contact pads on the optical component, and the connector pins extending from the package. Through-hole conductors extend between the opposite surfaces of the bridge such that electrical conductors and components mounted on the surfaces of the bridge can be electrically coupled to the optical component(s). In a preferred embodiment of the invention, the surface of the bridge facing the optical component has conductors which are coupled directly to the optical component's electrical contacts and to the external contact pins utilizing a conductive bonding agent to eliminate wire connections between the respective optical and electrical components.

It will become apparent to those skilled in the art that various modifications to the preferred embodiment of the invention as described herein can be made without departing from the spirit or scope of the invention as defined by the appended claims.

The invention claimed is:

1. An optical/electrical device comprising:
    a housing for an optical component;
    an optical component positioned in said housing and having at least one electrical contact thereon;
    a planar member of insulating material mounted in said housing in spaced aligned relationship to said optical component, said member including a first surface facing said electrical component, and a conductor on said first surface; and
    a conductive bonding material directly coupling said conductor to said contact of said optical component, and further including at least one through-hole connector extending between said first surface and an opposite surface of said member for coupling electrical conductors and components on opposite sides of said member to one another.

2. The optical/electrical device as defined in claim 1 and further including an electrical component mounted on said opposite surface of said member and coupled to said through-hole connector.

3. The optical/electrical device as defined in claim 2 and further including connector pins extending from said housing for coupling to said electrical component and to said optical component.

4. The optical/electrical device as defined in claim 3 wherein said conductor on said first surface of said member extends over one connector pin and is directly electrically coupled thereto.

5. The optical/electrical device as defined in claim 4 wherein said one connector pin and said conductor are electrically coupled by a conductive bonding material.

6. The optical/electrical device as defined in claim 5 wherein said bonding material is a conductive adhesive.

7. An optical/electrical device comprising:
   a housing for an optical component;
   an optical component positioned in said housing and having at least one electrical contact thereon;
   a planar member of insulating material mounted in said housing in spaced aligned relationship to said optical component, said member including a first surface facing said electrical component, and a conductor on said first surface; and
   a conductive bonding material comprising a conductive adhesive directly coupling said conductor to said contact of said optical component.

8. A package for an optical/electrical component comprising:
   a support for an optical component;
   an optical component having at least one electrical contact thereon, said optical component positioned on said support;
   a bridge comprising a planar member of insulating material positioned on said support in spaced aligned relationship to said optical component, said bridge including a first surface facing said electrical component, a conductor thereon, and an opposite surface;
   at least one through-hole connector extending between said first and opposite surfaces of said bridge for coupling electrical conductors and components on opposite sides of said bridge to one another;
   an electrical component mounted on said opposite surface of said bridge and coupled to said through-hole connector; and
   connector pins extending from said support for coupling to said electrical component and to said optical component, wherein said conductor on said first surface of said bridge extends over one connector pin and is directly electrically coupled thereto.

9. The package as defined in claim 8 wherein said one connector pin and said conductor are electrically coupled by a conductive bonding material.

10. The package as defined in claim 9 wherein said bonding material is a conductive adhesive.

11. The package as defined in claim 10 wherein said conductor of said bridge is aligned on said first surface with said contact on said optical component and directly electrically coupled thereto.

12. The package as defined in claim 11 wherein said conductor and contact are electrically coupled by a conductive bonding material.

13. The package as defined in claim 12 wherein said bonding material is a conductive adhesive.

14. The package as defined in claim 13 wherein said conductor on said first surface of said bridge extends over one connector pin and is directly electrically coupled thereto.

15. The package as defined in claim 14 wherein said one connector pin and said conductor are electrically coupled by a conductive bonding material.

16. The package as defined in claim 15 wherein said bonding material is a conductive adhesive.

17. An optical/electrical component and package comprising:
   a housing for an optical component;
   an optical component having electrical contacts thereon, said optical component positioned in said housing;
   a bridge of insulating material positioned in said housing in aligned relationship to said optical component, said bridge including a first surface facing said electrical component and an opposite surface;
   conductors formed on opposite sides of said bridge;
   at least one through-hole connector extending between said first and opposite surfaces of said bridge for coupling said electrical conductors on opposite sides of said bridge to one another;
   an electrical component mounted on said opposite surface of said bridge and coupled to said through-hole connector; and
   connector pins extending from said housing for coupling to said electrical component and to said optical component.

18. The package as defined in claim 17 wherein said conductor on said first surface of said bridge extends over one connector pin and is directly electrically coupled thereto.

19. The package as defined in claim 18 wherein said one connector pin and said conductor are electrically coupled by a conductive bonding material.

20. The package as defined in claim 19 wherein said bonding material is a conductive adhesive.

21. The package as defined in claim 17 wherein said conductor of said bridge is aligned on said first surface with one of said contacts on said optical component and directly electrically coupled thereto.

22. The package as defined in claim 21 wherein said conductor and contact are electrically coupled by a conductive bonding material.

23. The package as defined in claim 22 wherein said bonding material is a conductive adhesive.

24. A method of packaging an optical/electrical component comprising:
   positioning an optical component having an electrical contact in a housing;
   forming an electrical conductor on a bridge of insulating material;
   aligning said bridge of insulating material in spaced aligned relationship to the optical component;
   bonding said electrical conductor on said bridge to said electrical contact of said optical element; and
   mounting an electrical component on a surface of said bridge opposite said optical component.

25. The method of claim 24 and further including extending at least one through-hole connector between opposite surfaces of the bridge.

* * * * *